United States Patent [19]

Kubo

[11] Patent Number: 5,296,082

[45] Date of Patent: Mar. 22, 1994

[54] MOLD FOR PRINTED WIRING BOARD

[75] Inventor: Isamu Kubo, Saitama, Japan

[73] Assignee: Nippon CMK Corp., Japan

[21] Appl. No.: 853,115

[22] Filed: Mar. 18, 1992

[30] Foreign Application Priority Data

Mar. 20, 1991 [JP] Japan .................................. 3-081483

[51] Int. Cl.⁵ ............................................. B32B 31/14
[52] U.S. Cl. .................................... 156/500; 156/581;
        269/287; 269/900; 269/903; 83/942
[58] Field of Search ............... 156/252, 253, 245, 513,
        156/581, 500; 269/54.1, 54.4, 54.5, 287, 900,
        903; 83/167, 942, 953; 29/831, 837, 842, 852,
        865, 866

[56] References Cited

U.S. PATENT DOCUMENTS

| | | | |
|---|---|---|---|
| 3,232,158 | 2/1966 | Breeding | 83/942 |
| 3,307,442 | 3/1967 | Imhoff | 83/942 |
| 3,395,439 | 8/1968 | Palesi et al. | 269/903 |
| 3,700,226 | 10/1972 | Mrugala | 269/903 |

Primary Examiner—Caleb Weston
Attorney, Agent, or Firm—Bruce L. Adams; Van C. Wilks

[57] ABSTRACT

A mold used in producing printed wiring board is disclosed. The mold comprises upper dies and lower dies for sandwiching a printed wiring board therebetween, thereby performing drilling, punching or the like, one of said upper dies and lower dies having a press surface which is provided with concave or convex portions for absorbing steps caused by forming a printed wiring circuit on the printed wiring board.

15 Claims, 3 Drawing Sheets

MOLD FOR PRINTED WIRING BOARD

BACKGROUND OF THE INVENTION

1. Field of the Invention

The present invention relates to a mold used during the drilling of through-holes or the like or during the cutting of a large printed wiring board which has printed wiring circuits provided theron into a plurality of printed wiring boards.

2. Description of the Related Art

A printed wiring board is generally manufactured by subjecting a copper clad laminate to a series of treatments, such as etching, applying a solder resist, printing a shield layer, printing an overcoat layer, etc.

A mold for a printed wiring board is used in the process of drilling through-holes in the printed wiring board or in the process of cutting a large board having a plurality of printed wiring circuits provided thereon into a plurality of respective printed wiring boards.

FIGS. 7(a) and 7(b) show a conventional mold for use during a process of drilling through-holes or the like. The mold comprises a lower die 72 secured to a base 71 and an upper die 73 arranged to move up and down against the lower die 72 and operative so as to sandwich the printed wiring board (not shown) between it and the lower die 72. The upper die 73 is provided at the positions corresponding to where it is intended to drill the through-holes. The upper die 73 has a plurality of holes, through which punching pins 74 pass up and down during drilling. The lower die 72 is provided, at positions corresponding to respective punching pins 74, with punching holes 75, through which the punching pins 74 are inserted. The upper and lower dies 73,72 have flat press surfaces for sandwiching and fixing the printed board therebetween.

Initially, the printed wiring board, comprising only a base material, has a flat surface. However, at a later stage of manufacture, the board has an uneven surface, that is, it contains concave and convex regions, since the printed wiring circuit is formed on the base material by the above-mentioned series of treatments. Moreover, the depth of the concave and convex surface regions becomes large as the circuit construction becomes more complicated.

FIG. 8 shows a cross-section of a jumper circuit portion of a printed wiring board 1, in which an electrical circuit 3 and connecting lands 4 are provided on a base material 2. A solder resist 5 is applied on the circuit 3 and connecting lands 4. A jumper circuit 6 serves to electrically connect the connecting lands 4 located on both sides of the circuit 3. The jumper circuit is formed by printing a conductive ink along the exposed connecting land 4. An insulating overcoat 7 is applied on the jumper circuit 6, thereby forming the printed circuit board 1. The portion of the printed wiring board containing the jumper circuit 6 contains a step with a thickness which is physically greater than that of other regions of the printed wiring board. The thickness of the step is on the order of 0.1 mm, thereby presenting concave and convex regions on the surface of the printed wiring board.

If the printed wiring board containing a printed wiring circuit is sandwiched between the upper and lower dies of the conventional mold, a clearance or gap is formed between the flat press surface of the mold and the low level, or concave, portions of the printed wiring board, i.e., those portions containing no printed circuit elements. The mold thus cannot be pressed evenly over the whole surface of the printed wiring board, and thus, problems arise. For example, when drilling holes, the diameter of the holes changes and the hole becomes slanted. When cutting, a dimensional error arises. Moreover, the pressing force becomes uneven, resulting in deformation and cracking of the printed wiring board, accidental cutting of the printed wiring circuit, and injury to the press surface of the mold.

SUMMARY OF THE INVENTION

It is an object of the present invention to overcome the above described shortcomings associated with the conventional printed wiring board mold.

It is another object of the present invention to provide a mold for a printed wiring board capable of uniformly pressing the entire surface of the printed wiring board.

According to the present invention, there is provided a mold for a printed wiring board comprising upper and lower dies for sandwiching a printed wiring board therebetween during the course of drilling, punching or the like. At least one of the upper and lower dies has a press surface which is provided with concave and convex portions for absorbing steps caused by formation of a printed wiring circuit on the printed wiring board.

According to the above construction, at least the press surface of the mold is provided with concave portions corresponding to the convex portions of the printed wiring board. The concave portions absorb the step level of the convex portions of the printed wiring board, so that the printed wiring board can be uniformly pressed over the whole surface thereof.

DETAILED DESCRIPTION OF THE PREFERRED EMBODIMENT

Figure 1:
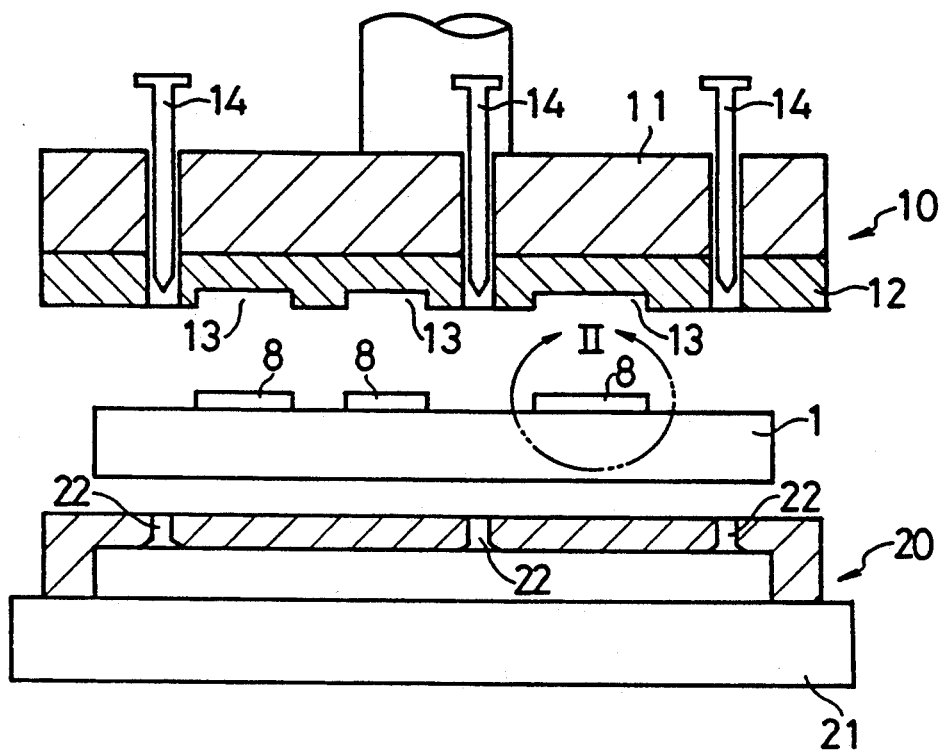
FIG. 1 is a cross-sectional view showing the construction of one embodiment of a mold for a printed wiring board according to the present invention.
Figure 2:
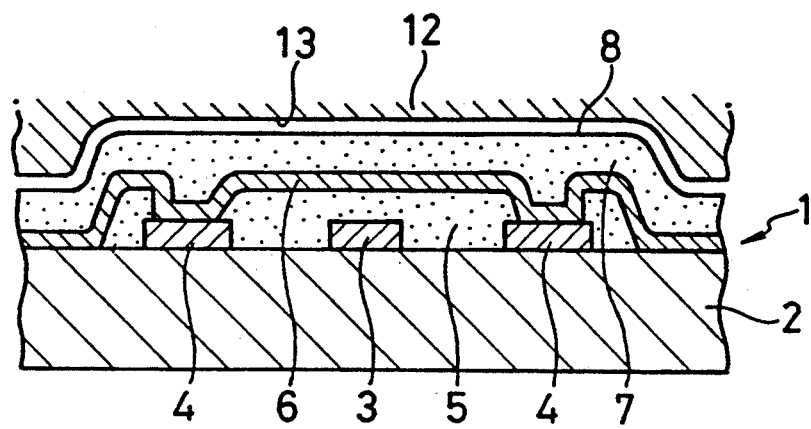
FIG. 2 is an enlarged cross-sectional view of an encircled portion designated by double arrow II in FIG. 1.
Figure 3:
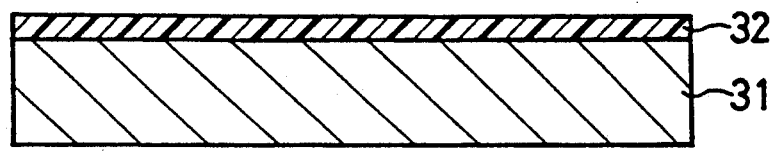
FIGS. 3 to 6 are cross-sectional views showing in sequence the formation of concave and convex steps on the press surface of the mold.
Figure 4:
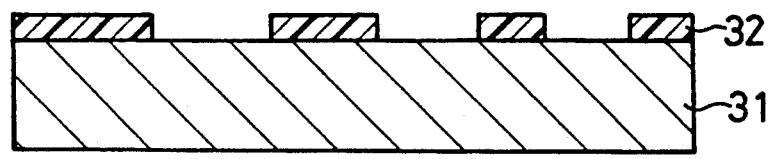
Figure 5:
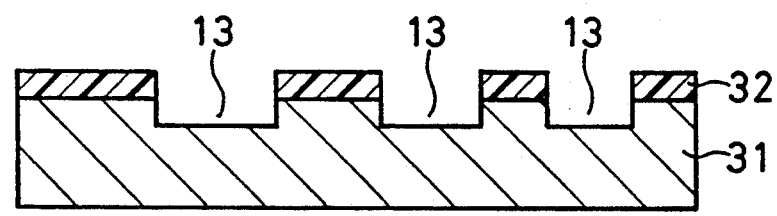
Figure 6:
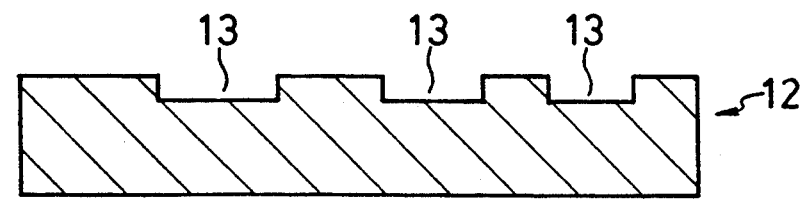
Figure 7A:
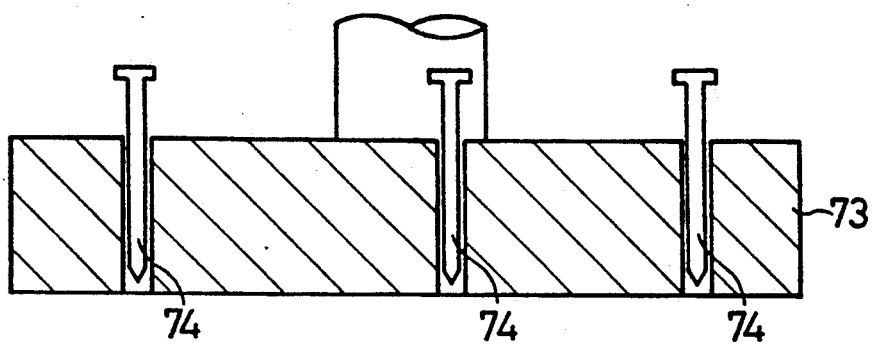
FIGS. 7(a and b) is a cross-sectional view showing the construction of a conventional mold.
Figure 7B:
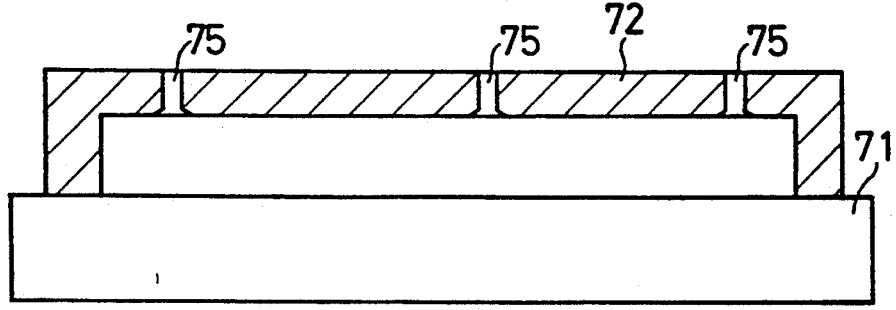
Figure 8:
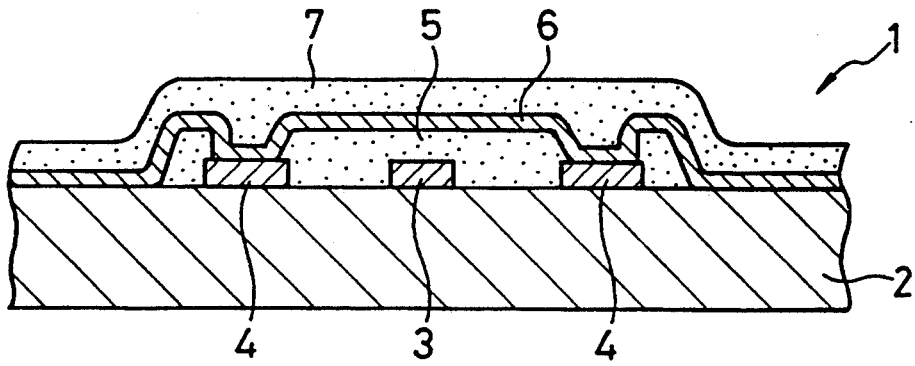
FIG. 8 is a cross-sectional view showing one embodiment of a concave and convex portion of the conventional printed wiring board.

FIG. 1 shows one embodiment of a mold for a printed wiring board according to the present invention, which is applied to a printed wiring board 1 on one surface of which a printed wiring circuit is provided. As shown in FIG. 2, the printed wiring board 1 is ultimately provided with a jumper circuit 6 for electrically connecting separated connecting lands 4 as in FIG. 8. A shield layer 7 for shielding electromagnetic waves is laminated on a conductive circuit through a solder resist layer (not shown). The jumper circuit 6 and the shield layer 7 portions have a higher level step than other regions of the printed wiring board. In FIG. 1, circuit forming regions having such a high step level are formed between flat regions of the printed wiring board 1 and are designated by reference numeral 8.

A mold applied to the printed wiring board 1 comprises an upper die 10 and a lower die 20. The upper die 10 serves to press the circuit forming surface of the printed wiring board 1 and is operational to move up and down. In this embodiment, the upper die 10 comprises a body portion 11 for effecting a driving force for vertical movement, and a press portion 12 detachably secured to the lower surface of the body portion 11. The press portion 12 is in contact with the circuit forming surface of the printed wiring board 1. The lower surface of the press portion 12 has concave and convex regions which oppositely correspond to the concave and convex regions of the printed wiring board 1. That is, concave regions 13 are formed on the regions of the press portion 12 corresponding to the convex circuit forming regions 8 of the printed wiring board 1 which are higher level regions. The other surfaces of the press portion 12 corresponding to the other regions of the printed wiring board are made flat. The concave regions 13 have the same depth as the height of the circuit forming regions 8 so that the concave regions 13 receive therein the step level of the circuit forming regions when the upper die 10 makes contact with the printed wiring board 1.

Therefore, the press portion 12 of the upper die 10 makes uniform contact with the whole surface of the printed wiring board 1, and thus a uniform pressing force can be effected along the entire surface of the printed wiring board 1. Punch pins 14 are provided to extend through the upper die 10. The punch pins 14 perform the drilling of the through-holes or the like on the printed wiring board 1 by their vertical movement. The lower die 20 is fixedly secured to a holder 21 to support the lower surface of the printed wiring board 1. In this case, the lower surface of the printed wiring board 1 is flat, since no printed wiring circuit is provided on the lower surface, so that the upper surface, that is, the press surface of the lower die 20, is also made flat. The lower die 20 is positioned opposite the punch pins 14 with punch holes 22, into which the punch pins 14 are inserted.

In the above construction, when the printed wiring board 1 is positioned and placed on the lower die 20 and then the upper die 10 is moved downwardly, to thereby sandwich the printed wiring board 1, the concave regions 13 of the press portion 12 are in contact with the circuit forming regions 8 of the printed wiring board 1. FIG. 2 shows such a contact situation, and the concave regions 13 have the same dimension as that of the convex circuit forming regions 8, so that the step level of the circuit forming regions 8 is absorbed in the concave portions 13, and thus, the other regions of the press portion 12 are also touched to the other portion of the printed wiring board 1 efficiently. In this way, the entire surface of the printed wiring board 1 is pressed evenly, so that no variations in the hole diameter or in the slant of the hole arise when the drilling is performed by the punch pins 14. Further, a dimensional error does not arise when the printed wiring board is cut. Moreover, a press force is effected over the whole surface of the printed wiring board 1 and the whole surface of the upper die evenly, so that cutting or disconnection of the printed wiring circuit, or deformation or cracking of the printed wiring board do not occur. The pressing surface of the mold is also not injured.

Next, one embodiment of a method of forming the concave regions 13 of the press portion 12 of the upper die 10 is explained with reference to FIGS. 3 to 6. The method forms the concave portion 13 by etching. A photosensitive paint 32 is applied onto a base plate 31, and then a photo mask (not shown) is placed on the paint 32. The photo mask has a pattern, bywhich the portions corresponding to the regions 13 are covered. The photosensitive paint 32 is exposed through the photo mask, so that the exposed portion of the paint 32 becomes hardened. Unexposed portions of the paint (corresponding to the concave regions 13 of the press potion 12) are removed by development (refer to FIG. 4). Then, the whole surface of the base plate 31 is subjected to an etching treatment, thereby forming the concave regions 13 on the surface of the base plate 31. Next, the paint 32 remaining on the base plate 31 is washed, thereby forming the press portion 12 having concave regions 13.

The present invention is not limited to the above described embodiment, and various modifications can be made. For example, the pressing surface of the upper die 10 may be provided with concave and convex regions without using the press portion 12. Moreover, the formation of concave and convex regions may be formed by machining means instead of etching means. In addition, it is understood that if printed wiring circuits are provided on both sides of the printed wiring board, press surfaces having concave portions may be provided on both the upper and lower dies in order to effect a press force evenly over the whole surface of both sides of the printed wiring board.

What is claimed is:

1. A mold for a printed wiring board having raised printed wiring circuit regions between flat regions on at least one opposed surface thereof, comprising: upper and lower dies for sandwiching the printed wiring board therebetween during drilling, punching or cutting of the printed wiring board, one of said upper and lower dies having a press surface which is provided with concave portions for receiving therein the raised printed wiring circuit regions of the printed wiring board and flat surfaces for pressing against the flat regions of the printed wiring board.

2. A mold for a printed wiring board, comprising: upper and lower dies having opposed press surfaces for sandwiching therebetween a printed wiring board having circuit elements on at least one of its opposed major surfaces, the circuit elements forming convex step regions between flat regions on the surface of the board, wherein the die which contacts the surface of the printed wiring board having thereon the circuit elements contains concave regions at positions corresponding to the convex step regions of the printed wiring board and flat surfaces corresponding to flat regions of the printed wiring board, each concave region having a depth which is deep enough to receive therein the corresponding convex step region of the printed wiring board so that an even pressure is applied between the upper and lower dies to the printed wiring board.

3. A mold according to claim 2; wherein the die which contacts the surface of the printed wiring board having circuit elements thereon comprises a body portion and a press portion detachably secured to the body portion, the concave regions being formed in the press portion.

4. A mold according to claim 2; wherein each die contains concave regions at positions corresponding to convex step regions of the board.

5. A mold according to claim 2; wherein each die comprises a body portion and a press portion detachably secured to the body portion, and concave regions formed in the press portion of each die.

6. A mold according to claim 2; wherein one of the upper and lower dies contains at least one punch pin operable to punch through-holes in the printed wiring board.

7. A mold according to claim 6; wherein the other of the upper and lower dies contains at least one punch hole positioned to receive the at least one punch pin during a through-hole punching operation.

8. A mold according to claim 2; wherein the press surface of one of the dies is flat.

9. A mold for a printed wiring board, comprising: a pair of opposed dies relatively movable toward and away form each other to sandwich therebetween a printed wiring board having a plurality of raised printed wiring circuit regions formed between flat regions of the printed wiring board, at least one of the dies having a plurality of concave regions positioned and dimensioned to receive therein respective ones of the raised printed wiring circuit regions and flat surfaces positioned and dimensioned to press against the flat regions of the printed wiring board when the pair of dies are moved toward each other to sandwich therebetween the printed wiring board.

10. A mold according to claim 9; wherein the pair of dies have a plurality of aligned punch holes, and punch members slidable in the punch holes for punching holes through the printed wiring board while the same is sandwiched between the dies.

11. A mold according to claim 9; wherein the die having the concave regions comprises a body portion, and a press portion detachably connected to the body portion, the press portion having the concave regions formed therein and being movable so that the flat surfaces come into pressing contact with the flat regions of the printed wiring board and the concave regions come into pressing contact with the raised printed circuit regions when the pair of dies are moved toward each other so that an even pressure is applied over the entire printed wiring board.

12. A mold according to claim 11; wherein the surface profile of each concave region corresponds to that of its corresponding raised printed wiring circuit region.

13. A mold according to claim 11; wherein the number of concave regions equals the number of raised printed wiring circuit regions.

14. A mold according to claim 9; wherein the surface profile of each concave region corresponds to that of its corresponding raised printed wiring circuit region.

15. A mold according to claim 9; wherein the number of concave regions equals the number of raised printed wiring circuit regions.

* * * * *